United States Patent
Choi et al.

(10) Patent No.: US 9,431,926 B2
(45) Date of Patent: Aug. 30, 2016

(54) VIBRATION GENERATING APPARATUS AND ELECTRONIC APPARATUS INCLUDING THE SAME

(71) Applicant: SAMSUNG ELECTRO-MECHANICS CO., LTD., Suwon-Si (KR)

(72) Inventors: Joon Choi, Suwon-Si (KR); Jae Kyung Kim, Suwon-Si (KR); Sang Jin Lee, Suwon-Si (KR); Dong Su Moon, Suwon-Si (KR)

(73) Assignee: MPLUS CO., LTD., Suwon-Si, Gyeonggi-Do (KR)

( * ) Notice: Subject to any disclaimer, the term of this patent is extended or adjusted under 35 U.S.C. 154(b) by 371 days.

(21) Appl. No.: 14/279,293

(22) Filed: May 15, 2014

(65) Prior Publication Data
US 2014/0346926 A1 Nov. 27, 2014

(30) Foreign Application Priority Data

May 23, 2013 (KR) .................. 10-2013-0058631
Nov. 13, 2013 (KR) .................. 10-2013-0137478

(51) Int. Cl.
| | |
|---|---|
| H01L 41/09 | (2006.01) |
| H02N 2/00 | (2006.01) |
| B06B 1/06 | (2006.01) |
| H01L 41/053 | (2006.01) |
| B06B 1/14 | (2006.01) |
| G06F 3/01 | (2006.01) |
| G06F 3/041 | (2006.01) |

(52) U.S. Cl.
CPC ............ *H02N 2/006* (2013.01); *B06B 1/0603* (2013.01); *B06B 1/14* (2013.01); *G06F 3/016* (2013.01); *G06F 3/041* (2013.01); *H01L 41/053* (2013.01); *H01L 41/0933* (2013.01)

(58) Field of Classification Search
CPC .......... B06B 1/14; G06F 3/016; G06F 3/041
USPC ................................... 310/328, 348
See application file for complete search history.

(56) References Cited

U.S. PATENT DOCUMENTS

| | | |
|---|---|---|
| 2012/0026103 A1 | 2/2012 | Woo et al. |
| 2012/0212100 A1 | 8/2012 | Lee |
| 2013/0002093 A1 | 1/2013 | Kim et al. |

(Continued)

FOREIGN PATENT DOCUMENTS

| | | |
|---|---|---|
| KR | 10-2011-0045486 A | 5/2011 |
| KR | 10-2012-0011306 | 2/2012 |

(Continued)

OTHER PUBLICATIONS

Office Action dated Oct. 23, 2015 for Korean Patent Application No. 10-2013-0137478 and its English summary provided by Applicant's foreign counsel.

(Continued)

*Primary Examiner* — Thomas Dougherty
(74) *Attorney, Agent, or Firm* — LRK Patent Law Firm

(57) ABSTRACT

A vibration generating apparatus may include a housing having an internal space, an elastic member mounted in the internal space, a piezoelectric element having one surface thereof mounted on the elastic member, and a mass body fixed to the other surface of the piezoelectric element by a buffering adhesive.

29 Claims, 18 Drawing Sheets

(56) References Cited

U.S. PATENT DOCUMENTS

| | | | |
|---|---|---|---|
| 2013/0106239 A1 | 5/2013 | Yun et al. | |
| 2015/0188027 A1* | 7/2015 | Moon | H01L 41/053 310/329 |
| 2015/0333699 A1* | 11/2015 | Kim | H03B 5/32 345/173 |

FOREIGN PATENT DOCUMENTS

| | | |
|---|---|---|
| KR | 10-2013-0003377 | 1/2013 |
| KR | 10-2013-0047604 | 5/2013 |

OTHER PUBLICATIONS

Office Action dated Apr. 6, 2015 for Korean Patent Application No. 10-2013-0137478 and its English summary provided by Applicant's foreign counsel.

* cited by examiner

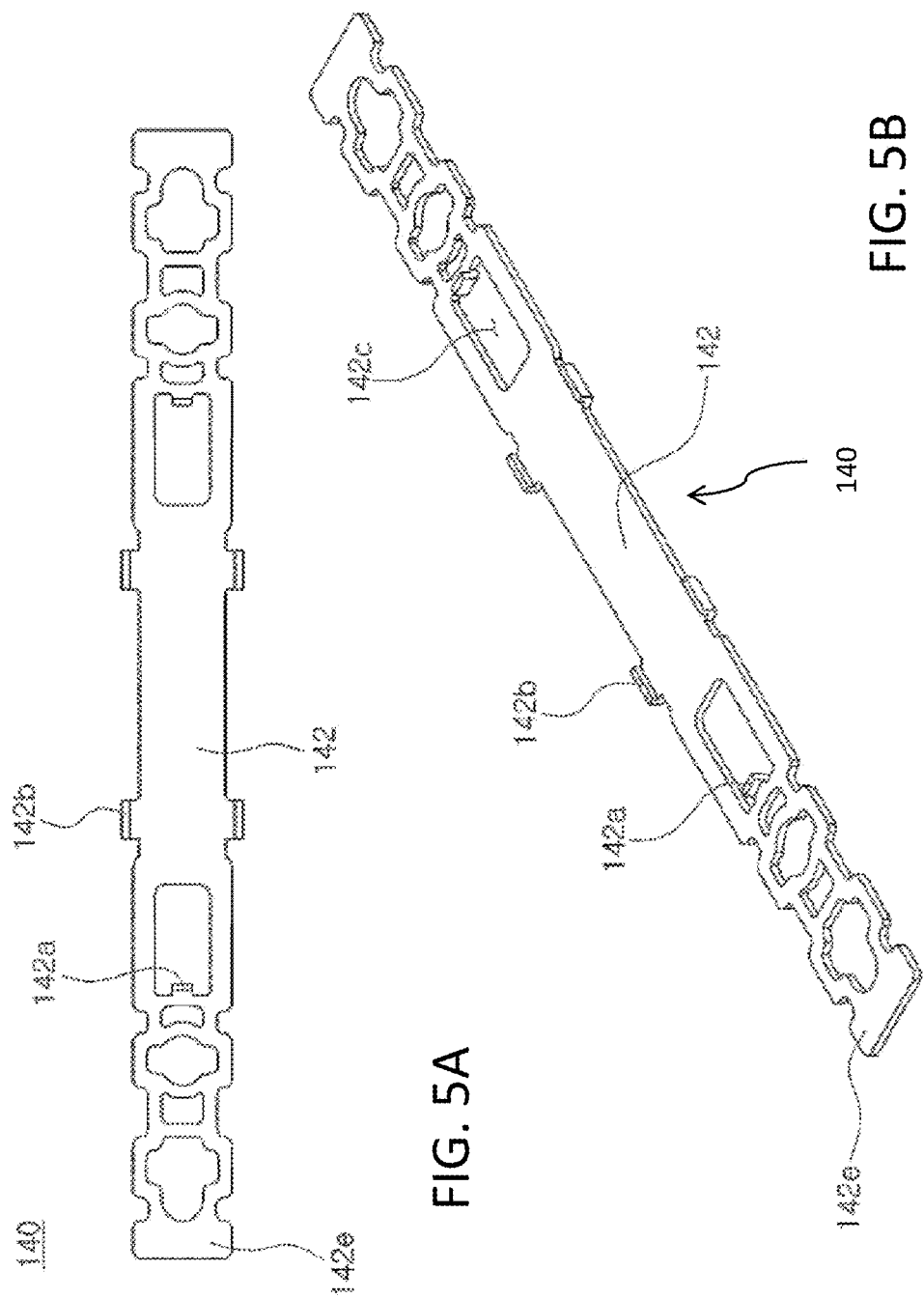

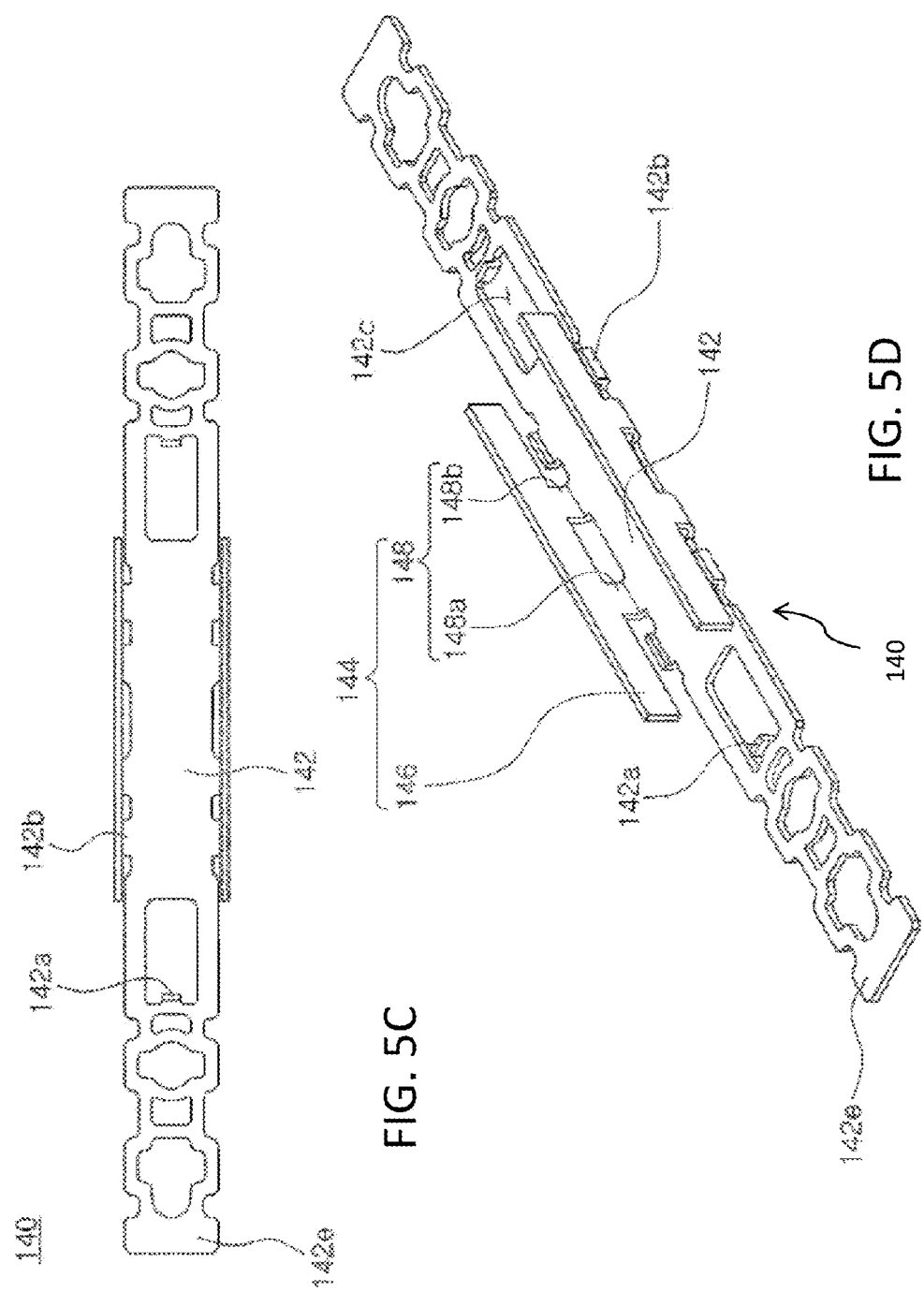

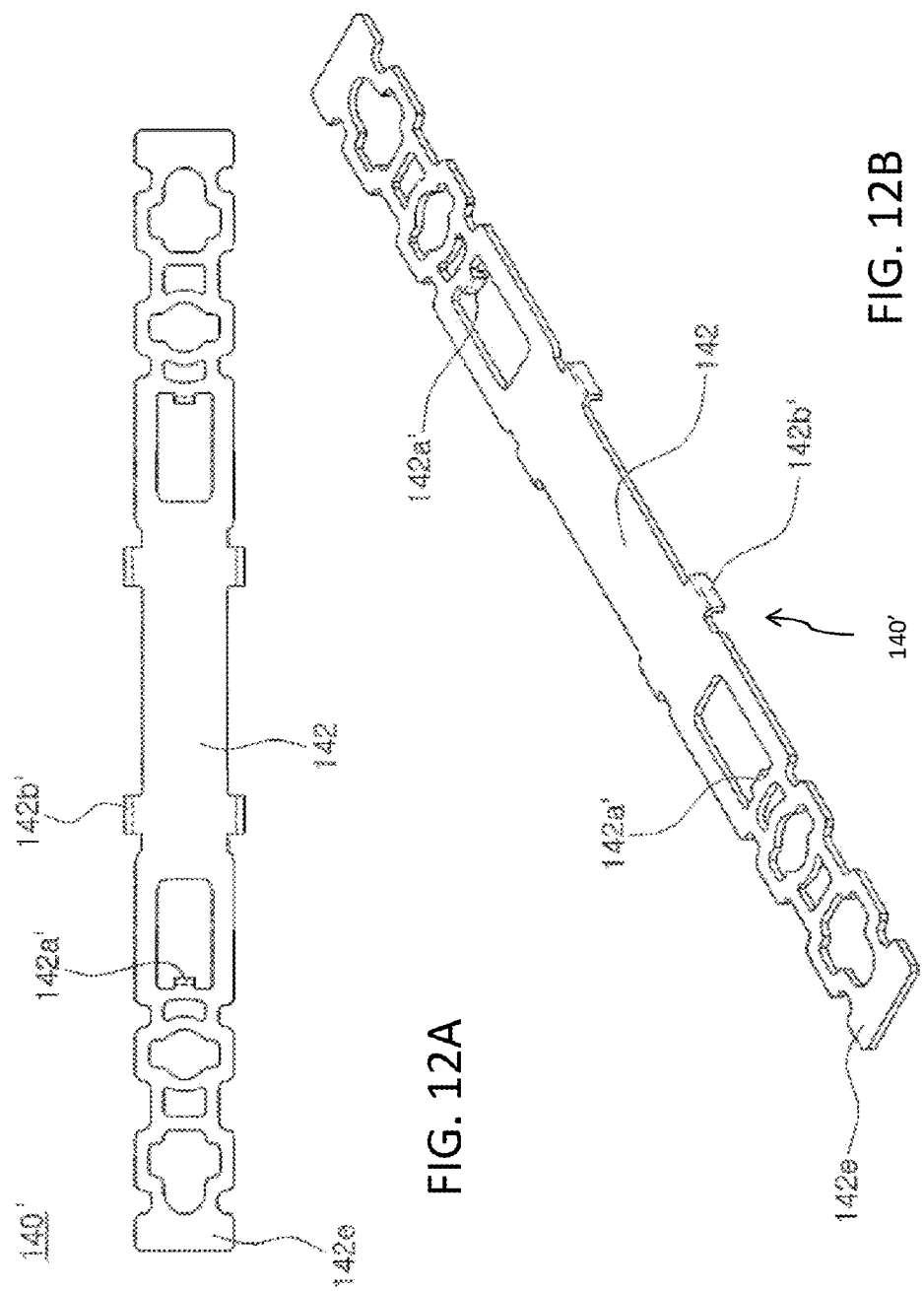

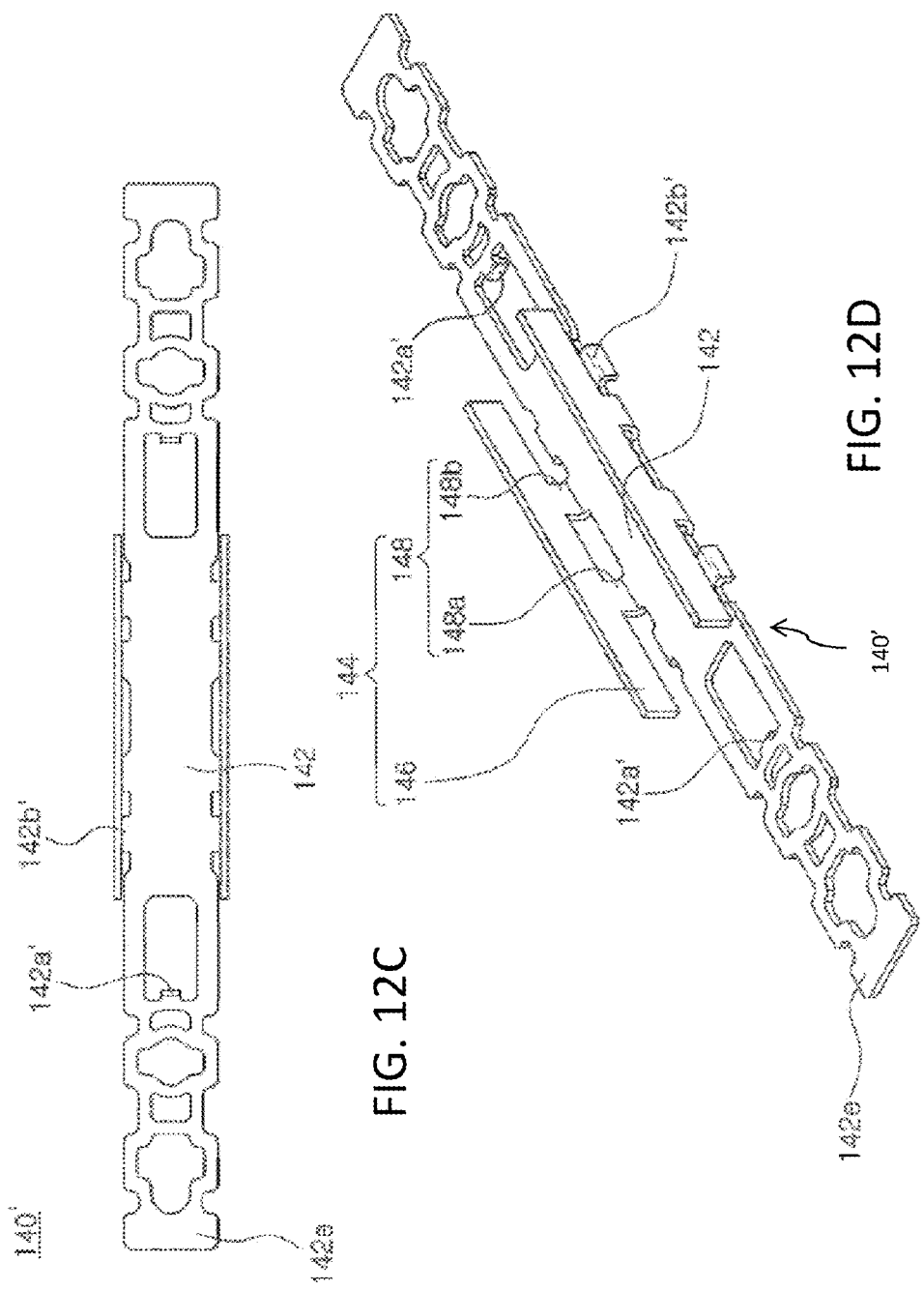

VIBRATION GENERATING APPARATUS AND ELECTRONIC APPARATUS INCLUDING THE SAME

CROSS-REFERENCE TO RELATED APPLICATION

This application claims the benefit of Korean Patent Application Nos. 10-2013-0058631 filed on May 23, 2013 and 10-2013-0137478 filed on Nov. 13, 2013, with the Korean Intellectual Property Office, the disclosures of which are incorporated in their entireties herein by reference.

BACKGROUND

The present disclosure relates to a vibration generating apparatus and an electronic apparatus including the same.

A vibration generating apparatus, converting electrical energy into mechanical vibrations using, for example, the principle of the generation of electromagnetic force, can be mounted in a mobile phone, or the like, to thereby be used for silently notifying a user of call reception by generating vibrations thereto. In addition, in accordance with rapid growth in the market for mobile devices such as mobile phones, and the like, and the trend for multiple functionality in mobile devices, mobile phone components having a small size and high quality have been desired. Therefore, the need for a vibration generating apparatus having a novel structure capable of overcoming disadvantages of existing vibration generating apparatuses and having improved quality has also increased.

Further, as touchscreen have been adopted into devices such as mobile phones, including smartphones, it is desirable to adopt vibration generating apparatuses to generate vibrations at the time of touching the touchscreen of these devices. In this regard, levels of performance particularly required in vibrations generated in the case of a touch interaction with a touchscreen are as follows. First, as the frequency of vibrations generated at the time of such touch interactions with a touchscreen can be greater than that of vibrations generated at the time of call reception, an operational lifespan of a vibration generating apparatus needs to be increased. Second, user satisfaction can be increased when a user experiences vibrations at the time of a touch interaction with a touchscreen and a response speed of the vibrations increases as a speed of touch interactions with a touchscreen increases.

As a product capable of implementing one or more of the characteristics as described above, there is provided a piezo haptic actuator. Such a piezo haptic actuator may use the principle of an inverse piezoelectric effect in which the displacement of a piezo element is generated when a voltage is applied thereto, and vibratory force is generated by allowing a mass body to move due to the generated displacement.

In a vibrator having such a structure, a frequency bandwidth in which a predetermined level or more of vibratory force may be obtained is relatively wide, such that a variety of vibration characteristics may be implemented. In addition, since the vibration generating apparatus may provide rapid operational response characteristics, it may be suitable for implementing haptic vibrations in mobile devices such as mobile phones, and the like.

However, such piezo elements may be damaged due to external impacts. For example, the piezo element may be damaged due to contact between the piezo element and a lower case when external impacts are applied to the vibrator.

Additionally, the elastic plate may be deformed or damaged due to external impacts, or the like, applied to the vibration generating apparatus in a length direction thereof. Therefore, the piezo element mounted on the elastic plate may be damaged.

SUMMARY

An aspect of the present disclosure may provide a vibration generating apparatus capable of, for example, preventing contact between a piezoelectric element and a mover even in the case that an external impact, or the like, is applied thereto.

An aspect of the present disclosure may also provide a vibration generating apparatus capable of absorbing impacts as well as preventing contact between a piezo element and a mover.

According to an aspect of the present disclosure, a vibration generating apparatus may include a housing having an internal space, an elastic member mounted in the internal space, a piezoelectric element having one surface thereof mounted on the elastic member, and a mass body fixed or coupled to another surface of the piezoelectric element by a buffering adhesive. The buffering adhesive may include a base member having buffering properties, and one or more adhesive layers applied to one or both surfaces of the base member. The base member may be formed of a porous material. The base member may have elastic force.

The elastic member may include a bottom plate having one surface thereof on which the piezoelectric element is mounted.

The elastic member may further include one or more extension plates extended from both ends of the bottom plate in a width direction, in a height direction.

Each of the extension plates may include a connection part having one end connected to the bottom plate and extended from a central portion of the bottom plate in a length direction, in the height direction, and a support plate part formed on another end of the connection part in the length direction and guiding or supporting the mass body.

The buffering adhesive may have a length shorter than that of the piezoelectric element in a length direction.

The buffering adhesive may have a width equal to or smaller than that of the piezoelectric element.

The vibration generating apparatus may further include a mass body cover covering the mass body, and the buffering adhesive may be interposed between the mass body cover and the piezoelectric element.

The buffering adhesive may be an adhesive having buffering force or properties.

An interval between an end portion of the mass body and an inner surface of the housing in a length direction may be equal to or less than an elastic limit of the buffering adhesive.

The mass body and the elastic member may not contact each other.

According to another aspect of the present disclosure, a vibration generating apparatus may include a housing having an internal space, an elastic member mounted in the internal space, a piezoelectric element having one surface thereof mounted on the elastic member, and a mass body buffering-coupled to the piezoelectric element or the elastic member and displaced by deformation of the piezoelectric element.

According to another aspect of the present disclosure, a vibration generating apparatus may include a housing having an internal space, an elastic member mounted in the internal space, a piezoelectric element mounted on one surface of the elastic member, and a mass body coupled or fixed to another surface of the elastic member by a buffering adhesive.

According to another aspect of the present disclosure, an electronic apparatus may include a display module displaying an image in response to selection of a user, a case having an internal space in which the display module is received, and a vibration generating apparatus mounted in the case. The vibration generating apparatus may comprise a housing having an internal space, an elastic member mounted in the internal space of the housing, a piezoelectric element having one surface thereof mounted on the elastic member and vibrating the elastic member by deformation, and a mass body buffering-coupled to the piezoelectric element or the elastic member.

The vibration generating apparatus may be mounted on an inner surface of the case.

The vibration generating apparatus may be mounted on a lower surface of the display module.

The display module may include a touch panel receiving a user touch interaction, and a display panel contacting a lower surface of the touch panel and displaying or providing a corresponding image responding to or depending on the touch interaction with the touch panel.

In some embodiments, a vibration generating apparatus may comprise a piezoelectric element deforming in response to an electric signal, an elastic member vibrated by deformation of the piezoelectric element, a mass body, and an adhesive with buffering properties configured to couple and buffer between the mass body and the piezoelectric element.

The adhesive with the buffering properties may comprise a base layer having the buffering properties, and an adhesive layer arranged on at least one surface of the base layer. The base layer may comprise a porous material.

The mass body may comprise a mass body cover covering the mass body, and the adhesive with the buffering properties may be attached to one surface of the mass body cover and one surface of the piezoelectric element.

A length of the adhesive with the buffering properties may be shorter than a length of the piezoelectric element. A width of the adhesive with the buffering properties may be equal to or smaller than a width of the piezoelectric element.

In some embodiments, a vibration generating apparatus may comprise a piezoelectric element deforming in response to an electric signal, an elastic member vibrated by deformation of the piezoelectric element, a mass body, and an adhesive with buffering properties configured to couple and buffer between the mass body and the elastic member. The piezoelectric element may be mounted on one surface of the elastic member, and another surface of the elastic member may be attached to the adhesive with the buffering properties.

The adhesive with the buffering properties may comprise a base layer having the buffering properties, and an adhesive layer arranged on at least one surface of the base layer. The base layer may comprise a porous material.

The mass body may comprise a mass body cover covering the mass body, and the adhesive with the buffering properties attached to one surface of the mass body cover and the another surface of the elastic member.

BRIEF DESCRIPTION OF DRAWINGS

Embodiments of the present disclosure will be more clearly understood from the following detailed description taken in conjunction with the accompanying drawings, in which:

FIGS. 5A and 5B are a plan view and a perspective view illustrating an elastic member of the vibration generating apparatus according to an exemplary embodiment of the present disclosure;

FIGS. 5C and 5D are a plan view and a perspective view illustrating an elastic member of a vibration generating apparatus according to another exemplary embodiment of the present disclosure;

FIGS. 12A and 12B are a plan view and a perspective view illustrating an elastic member of the vibration generating apparatus according to another exemplary embodiment of the present disclosure;

FIGS. 12C and 12D are a plan view and a perspective view illustrating an elastic member of a vibration generating apparatus according to another exemplary embodiment of the present disclosure;

DETAILED DESCRIPTION

Figure 1:
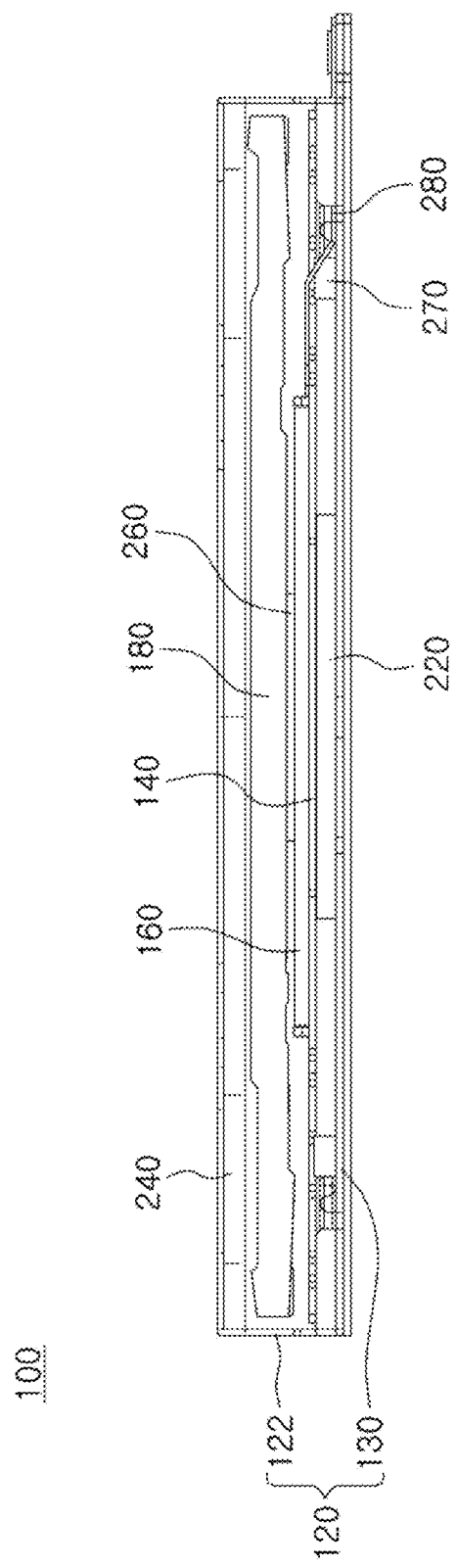
FIG. 1 is a cross-sectional view of a vibration generating apparatus according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

A vibration generating apparatus 100 according to an exemplary embodiment of the present disclosure may have a shape in which a buffer material having adhesion 260 is interposed between a mass body 180 and a piezoelectric element 160 disposed to face each other, such that the mass body 180 is adhered to the piezoelectric element 160. In the vibration generating apparatus 100, the piezoelectric element 160 is installed on one surface (for example, an upper surface) of an elastic member, for example, such that damage to the piezoelectric element 160 due to contact between the piezoelectric element 160 and the elastic member 140, or the like, on external impacts may be prevented.

Figure 2:
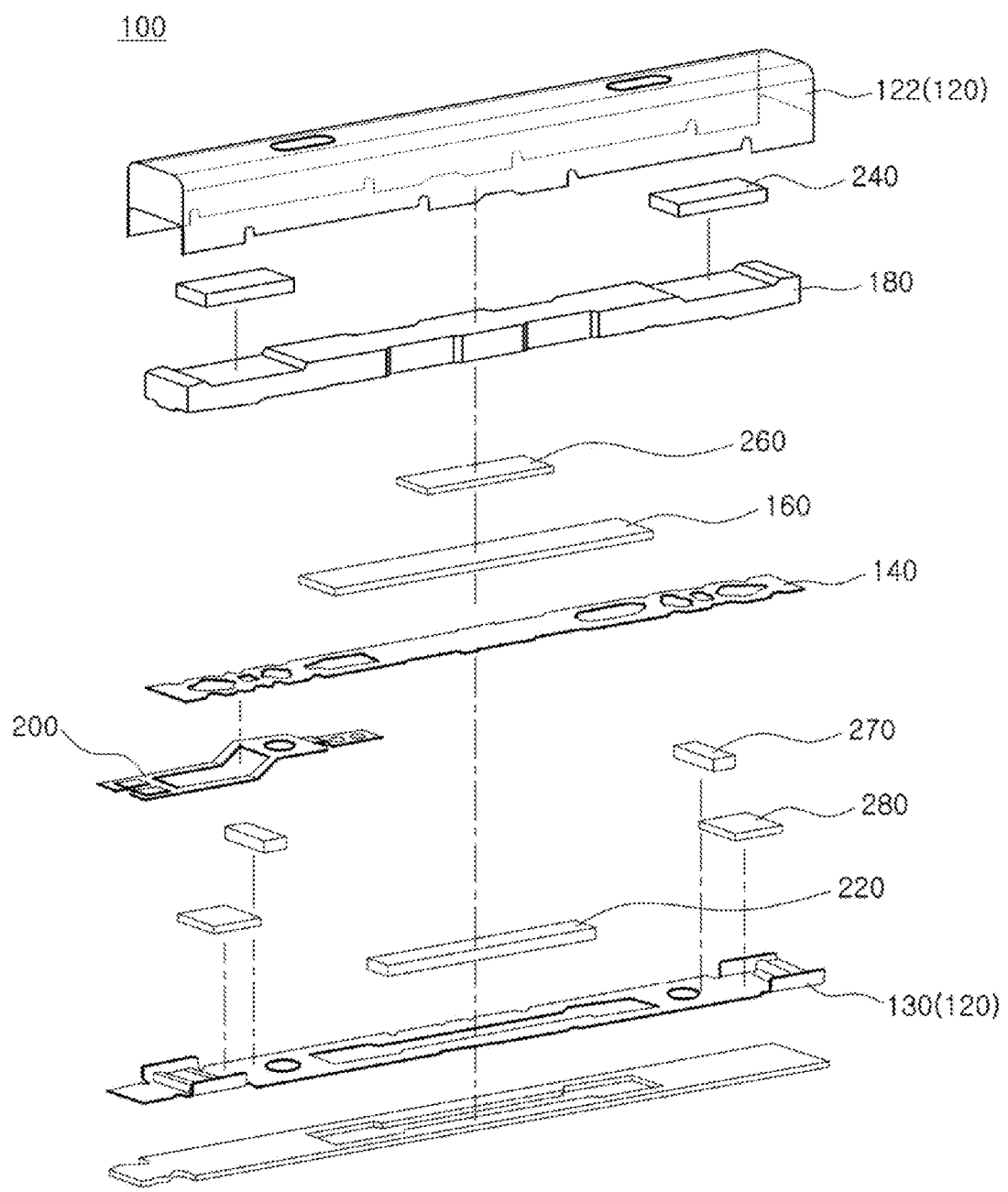
FIG. 2 is an exploded perspective view of the vibration generating apparatus according to an exemplary embodiment of the present disclosure.

FIG. 1 is a cross-sectional view of a vibration generating apparatus according to an exemplary embodiment of the present disclosure. FIG. 2 is an exploded perspective view of the vibration generating apparatus according to an exemplary embodiment of the present disclosure.

Referring to FIGS. 1 and 2, the vibration generating apparatus 100 may include a housing 120 including an upper case 122 and a lower case 130, an elastic member 140, a piezoelectric element 160, a mass body 180, a circuit board 200, a buffer member 220, a damper member 240, and a buffering adhesive or an adhesive with buffering properties 260. The vibration generating apparatus 100 may further include one or more stoppers 270 and one or more buffer members 280 interposed between the elastic member 140 and the lower case 130.

Figure 3:
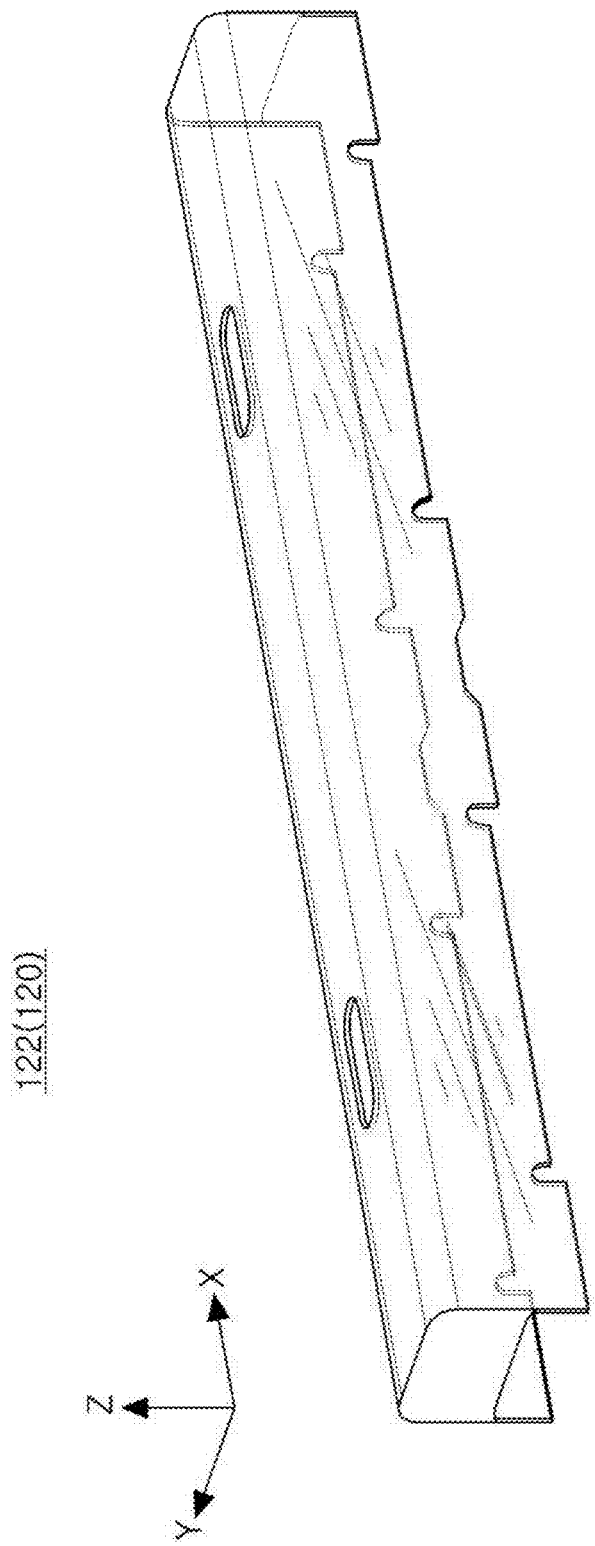
FIG. 3 is a perspective view of an upper case of the vibration generating apparatus according to an exemplary embodiment of the present disclosure.

The housing 120 may include the upper case 122 and the lower case 130. For instance, the upper case 122 may have a box shape having an internal space, and the lower case 130 may have a plate shape. FIG. 3 is a perspective view illustrating the upper case 122 of the housing 120.

For illustration purposes only, terms with respect to directions will be defined. In FIG. 3, a length direction refers to an X-axial direction, a width direction refers to a Y-axial direction, and a height direction refers to a Z-axial direction. Further, the terms defined above will be used below as having the same meaning as the above-mentioned meaning. That is, the above-mentioned terms with respect to the respective components will indicate the same directions as the above-mentioned directions.

Figure 4:
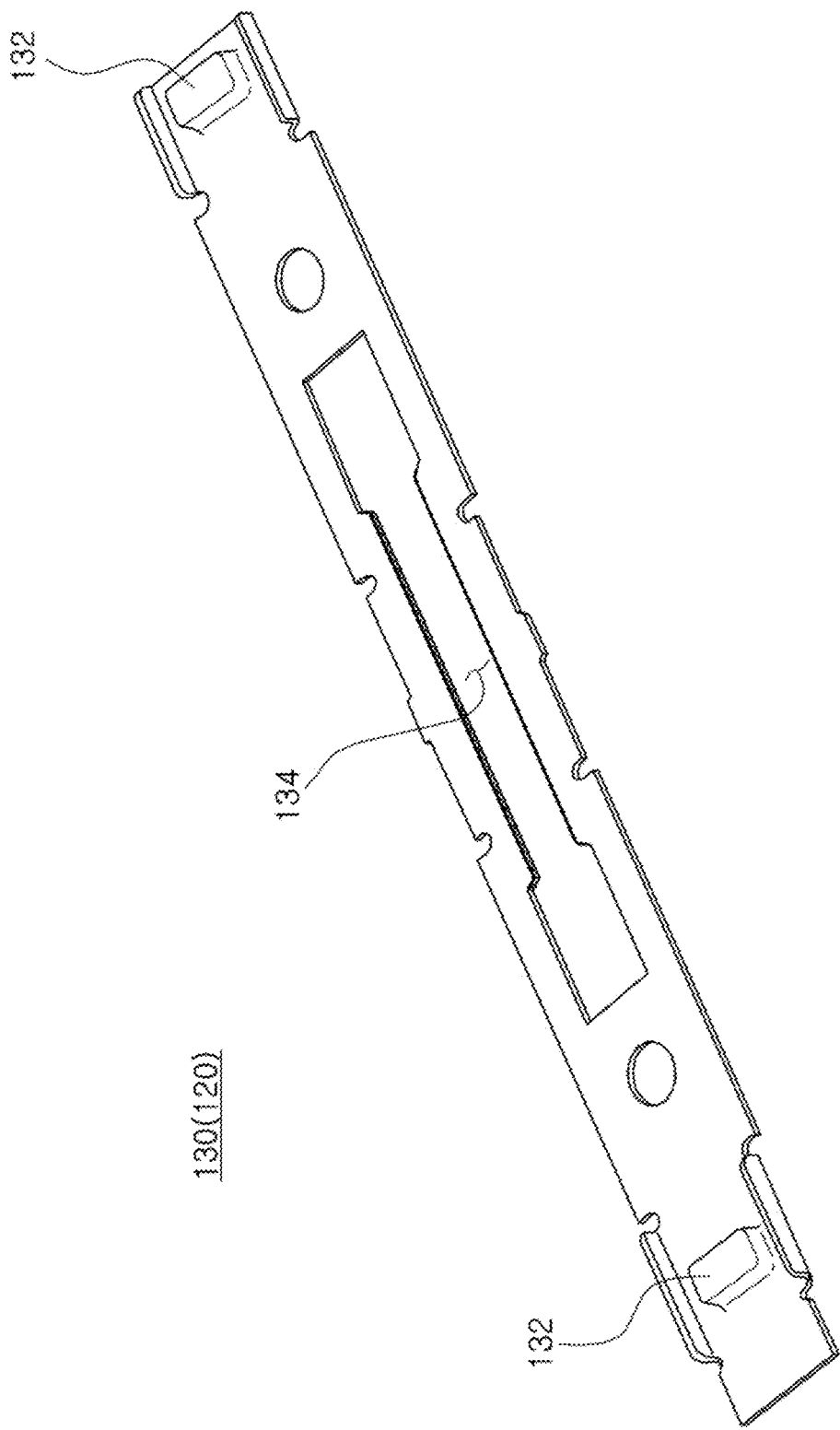
FIG. 4 is a perspective view of a lower case of the vibration generating apparatus according to an exemplary embodiment of the present disclosure.

FIG. 4 is a perspective view of a lower case of the vibration generating apparatus according to an exemplary embodiment of the present disclosure.

The lower case 130 may have a plate shape as shown in FIG. 4. In addition, the lower case 130 may have one or more protrusion parts 132 formed at one or both end portions thereof in order to support both end portions of the elastic member 140 (See FIG. 1). The protrusion parts 132 maybe formed by denting and may have a square pillar shape. However, this is only an example, and the present disclosure is not limited thereto.

In addition, the lower case 130 may have a penetration hole 134 formed in a central portion thereof so that the buffer member 220 may penetrate therethrough. A shape of the penetration hole 134 may be variously changed.

FIGS. 5A and 5B are a plan view and a perspective view illustrating an elastic member of the vibration generating apparatus according to an exemplary embodiment of the present disclosure, respectively.

Referring to FIGS. 5A and 5B, the elastic member 140 may have a plate shape and include one or more support parts 142e formed in one or both end portions thereof in the length direction. The support parts 142e may be supported by the protrusion parts 132 of the lower case 122, shown in FIG. 4, described above.

In addition, the elastic member 140 having the plate shape may be provided with a plurality of support protrusions 142a and 142b for installing or coupling the piezoelectric element 160 (See FIG. 1). Two support protrusions 142a may support both end surfaces of the piezoelectric element 160, respectively, and the support protrusions 142b may support two side surfaces (front and rear surfaces) of the piezoelectric element 160 except for the both end surfaces thereof. Therefore, the piezoelectric element 160 may be installed in a predetermined position of the elastic member 140, and separation of the piezoelectric element 160 from a bottom plate 142 of the elastic member 140 may be prevented.

Next, FIGS. 5C and 5D are a plan view and a perspective view illustrating an elastic member of a vibration generating apparatus according to another exemplary embodiment of the present disclosure, respectively. The elastic member 140 according to another exemplary embodiment shown in FIGS. 5C and 5D may further include extension plates 144 as compared with the elastic member 140 according to an exemplary embodiment shown in FIGS. 5A and 5B. Next, the elastic member 140 according to another exemplary embodiment shown in FIGS. 5C and 5D will be described.

Referring to FIGS. 5C and 5D, the elastic member 140 may include the bottom plate 142 and one or more extension plates 144. First, the bottom plate 142 of the elastic member 140 will be described. The bottom plate 142 may be provided with the plurality of support protrusions 142a and 142b for installing the piezoelectric element 160 (See FIG. 1). Two support protrusions 142a may support the both end surfaces of the piezoelectric element 160, respectively, and the support protrusions 142b may support two side surfaces (front and rear surfaces) of the piezoelectric element 160 except for the both end surfaces thereof. Therefore, the piezoelectric element 160 may be installed in a predetermined position of the elastic member 140, and separation of the piezoelectric element 160 from the bottom plate 142 of the elastic member 140 may be prevented.

In addition, the bottom plate 142 may include the support parts 142e formed in one or both end portions thereof, and the support parts 142e may be supported by the protrusion parts 132 of the lower case 122, shown in FIG. 4, described above.

In addition, the extension plates 144 may include support plate parts 146 covering front and rear surfaces of the mass body 180 and connection parts 148 connecting the support plate parts 146 and the bottom plate 142 to each other.

The connection parts 148 may be extended from front and rear surfaces of the bottom plate 142. In addition, each of the connection parts 148 may include first and second connection parts 148a and 148b disposed to be spaced apart from each other by a predetermined interval.

Further, the support plate parts 146 may be extended in a length direction of the mass body 180.

Figure 6:
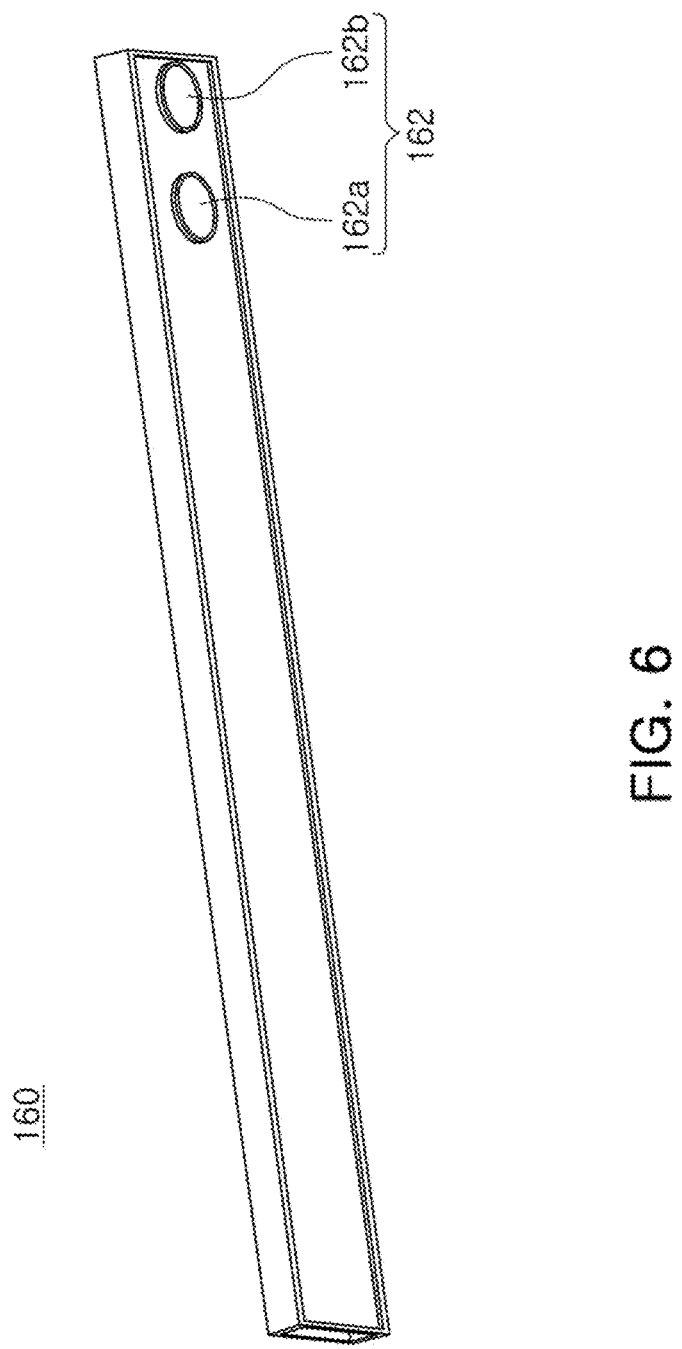
FIG. 6 is a bottom perspective view illustrating a piezoelectric element of the vibration generating apparatus according to an exemplary embodiment of the present disclosure.

FIG. 6 is a bottom perspective view illustrating a piezoelectric element of the vibration generating apparatus according to an exemplary embodiment of the present disclosure.

Referring to FIG. 6, the piezoelectric element 160 may be fixedly installed on the bottom plate 142 of the elastic member 140, shown in FIGS. 5A-5D, as described above, and may have, for example, but not limited to, a rectangular parallelepiped shape.

In addition, the piezoelectric element 160 may have electrodes 162 provided on a lower surface thereof. The electrodes 162 may protrude from the lower surface of the piezoelectric element 160, and include a positive ('+') electrode 162a and a negative ('−') electrode 162b.

Figure 7A:
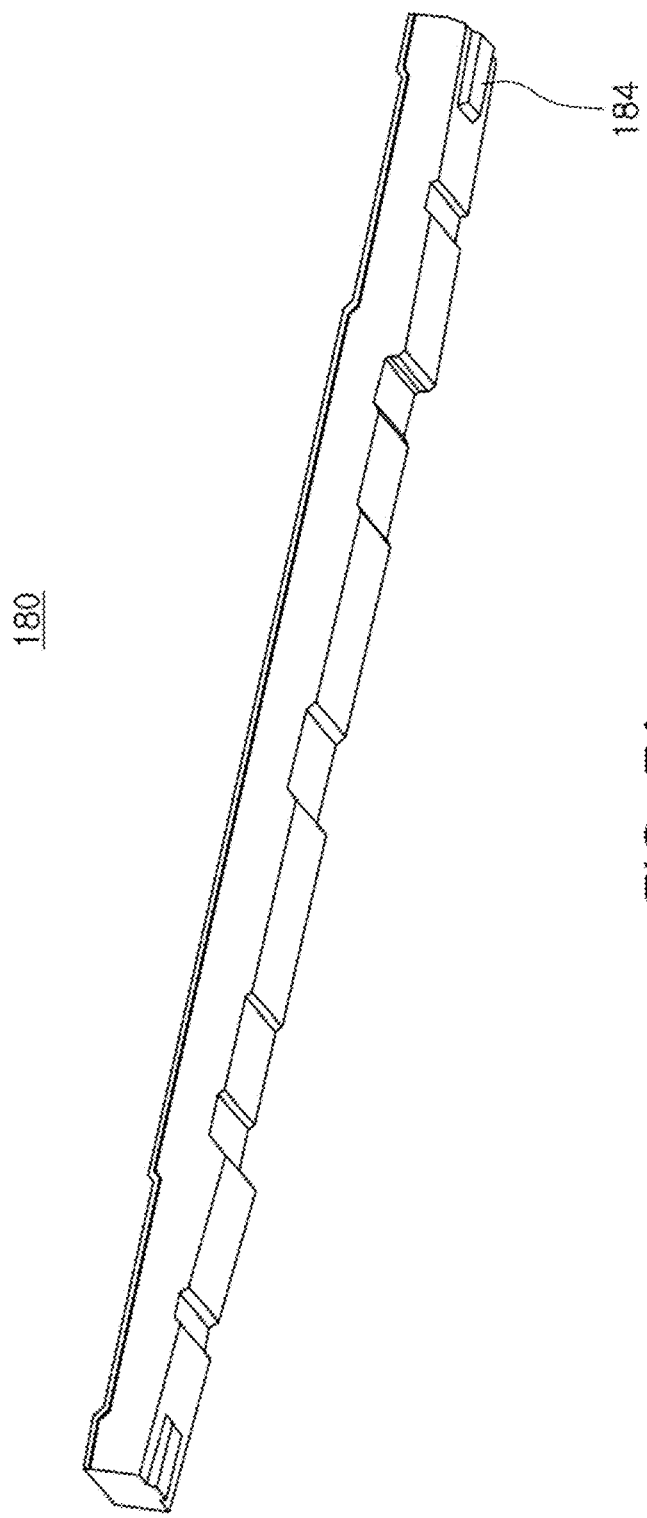
FIG. 7A is a bottom perspective view illustrating a mass body of the vibration generating apparatus according to an exemplary embodiment of the present disclosure.

FIG. 7A is a bottom perspective view illustrating a mass body of the vibration generating apparatus according to an exemplary embodiment of the present disclosure.

Referring to FIG. 7A, the mass body 180 may have, for example, but not limited to, a bar shape.

The mass body 180 may include one or more stopper parts 184 formed on one or both end portions thereof, respectively, in order to limit displacement of the mass body 180 at the time of elastic deformation of the elastic member 140. That is, the stopper parts 184 may contact the end portions of the bottom plate 142 of the elastic member 140 to limit the displacement of the mass body 180. Therefore, contact between the mass body 180 and an inner region of the bottom plate 142 disposed inwardly of the both end portions of the bottom plate 142 may be prevented.

In addition, the mass body 180 may be buffering-coupled to the piezoelectric element 160. For example, the mass body 180 may be adhered or coupled to the piezoelectric element 160 using the buffering adhesive 260. The buffering adhesive 260 may have a buffer material having adhesion or adhesive having buffering properties. The buffering adhesive 260 may be an adhesive, double-sided tape, or the like. The buffering adhesive 260 may be formed of any material capable of absorbing impacts and/or allowing the mass body 180 and the piezoelectric element 160 to be bonded to each other may be used. Thus, as the buffering adhesive 260, a material in which a soft adhesive is applied to Poron, silicon, rubber, a poly material, or the like, or an adhesive including these materials may be used. In a case in which the buffering adhesive 260 is an adhesive, the adhesive may be formed of a silicon resin based material.

The buffering adhesive 260 may not hinder deformation of the piezoelectric element 160 that is continuously and repeatedly expanded, contracted, and bent. A structure of the buffering adhesive will be described in detail below with reference to FIG. 9.

In addition, the buffering adhesive 260 may have a length shorter than that of the piezoelectric element 160 in the length direction. The buffering adhesive 260 may have a width equal to or smaller than that of the piezoelectric element 160. A size of the buffering adhesive 260 may be variously formed within a range in which the deformation of the piezoelectric element 160 is not hindered.

In addition, the mass body 180 may be disposed above the piezoelectric element 160 in a state in which the mass body 180 is mounted in a mass body cover 170 to be described below. In this case, the mass body cover 170 and the piezoelectric element 160 may be adhered to each other using the buffering adhesive 260.

Meanwhile, the buffering adhesive 260 may have elastic force restoring the mass body 180 to an original position thereof in a case in which the mass body 180 moves from the original position by inertial force due to an external impact.

In addition, sufficient elastic force may be required such that the mass body 180 may be restored to the original position thereof.

Therefore, in an exemplary embodiment of the present disclosure, an interval between an end portion of the mass body 180 and an inner surface of the housing 120 in the length direction may be equal to or less than an elastic limit of the buffering adhesive 260. That is, when the interval is equal to or less than the elastic limit of the buffering adhesive 260, the housing 120 may serve as a stopper stopping deformation of the mass body 180 in the length direction, such that the mass body 180 may be deformed by an amount equal to or less than the elastic limit of the buffering adhesive 260. Therefore, the buffering adhesive 260 may sufficiently perform functions thereof.

For example, the interval between the end portion of the mass body 180 and the inner surface of the housing 120 in the length direction may be 3 mm or less. Therefore, the elastic limit of the buffering adhesive 260 may be 3 mm or more.

As described above, since the mass body 180 is not directly coupled to the elastic member 140, and may be coupled to the piezoelectric element 160 using the buffering adhesive 260, the elastic member 140 may not be deformed even in a case in which external impacts, or the like, occur.

That is, although the elastic member 140 serves to provide elastic force in response to the deformation of the piezoelectric element 160, it may not be directly coupled to the mass body 180. Therefore, in a case in which the external impact, or the like, is present, impacts occurring by inertial force of the mass body 180 may not be transferred directly to the elastic member 140. Therefore, reliability of the elastic member 140 may be improved.

Figure 7B:
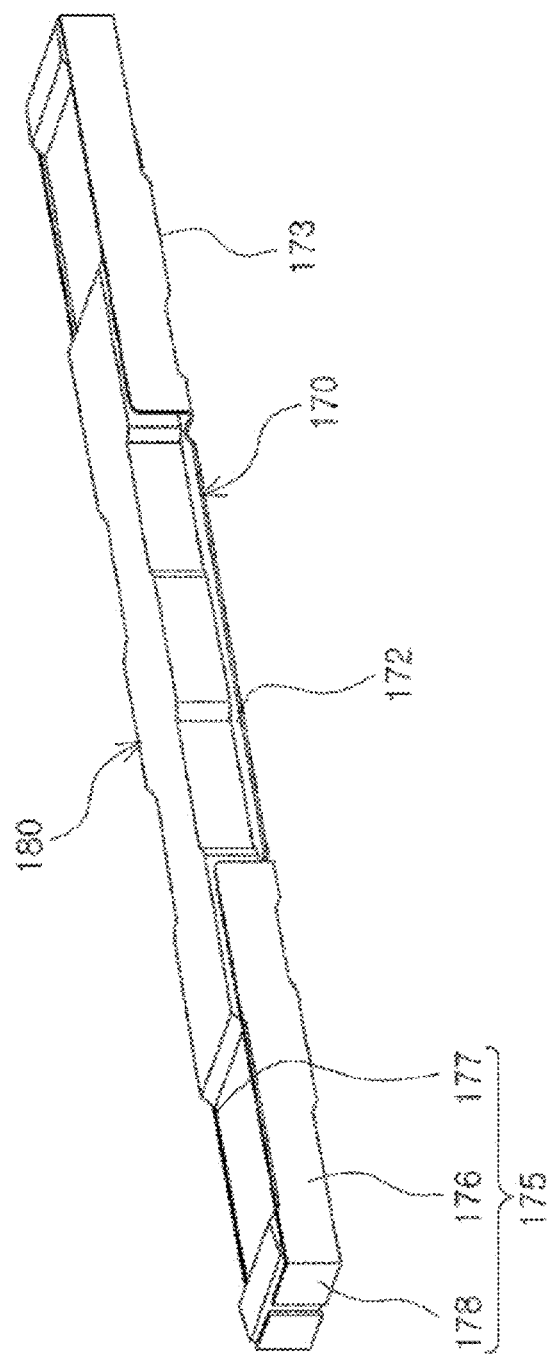
FIG. 7B is a perspective view illustrating a mass body of the vibration generating apparatus with a mass body cover according to an exemplary embodiment of the present disclosure.

FIG. 7B is a perspective view illustrating a mass body of the vibration generating apparatus with a mass body cover according to an exemplary embodiment of the present disclosure.

Referring to FIG. 7B, the mass body 180 may be coupled to the piezoelectric element 160 using the buffering adhesive 260 in a state in which the mass body 180 is inserted inside the mass body cover 170. The mass body cover 170 may be formed such that the mass body 180 may be inserted therein.

The mass body cover 170 may include a bottom plate 172 and a mounting plate 173 supporting a lower surface of the mass body 180, and support plates 175 extended from the bottom plate 172 and the mounting plate 173 toward side and end surfaces of the mass body 180. The support plates 175 may include front and rear surface support plates 176 and 177 supporting front and rear surfaces of the mass body 180, respectively, and end portion support plates 178 supporting the end portions of the mass body 180.

Here, the end portion support plates 178 may protrude from end portions of the front and rear surface support plates 176 and 177 in the length direction toward the end surfaces of the mass body 180, respectively.

The bottom plate 172 and the mounting plate 173 may be discontinuously provided in the length direction as shown in FIG. 7B, but not limited thereto. The bottom plate 172 and the mounting plate 173 maybe integrated with each other and formed to be continued in the length direction.

Figure 8:
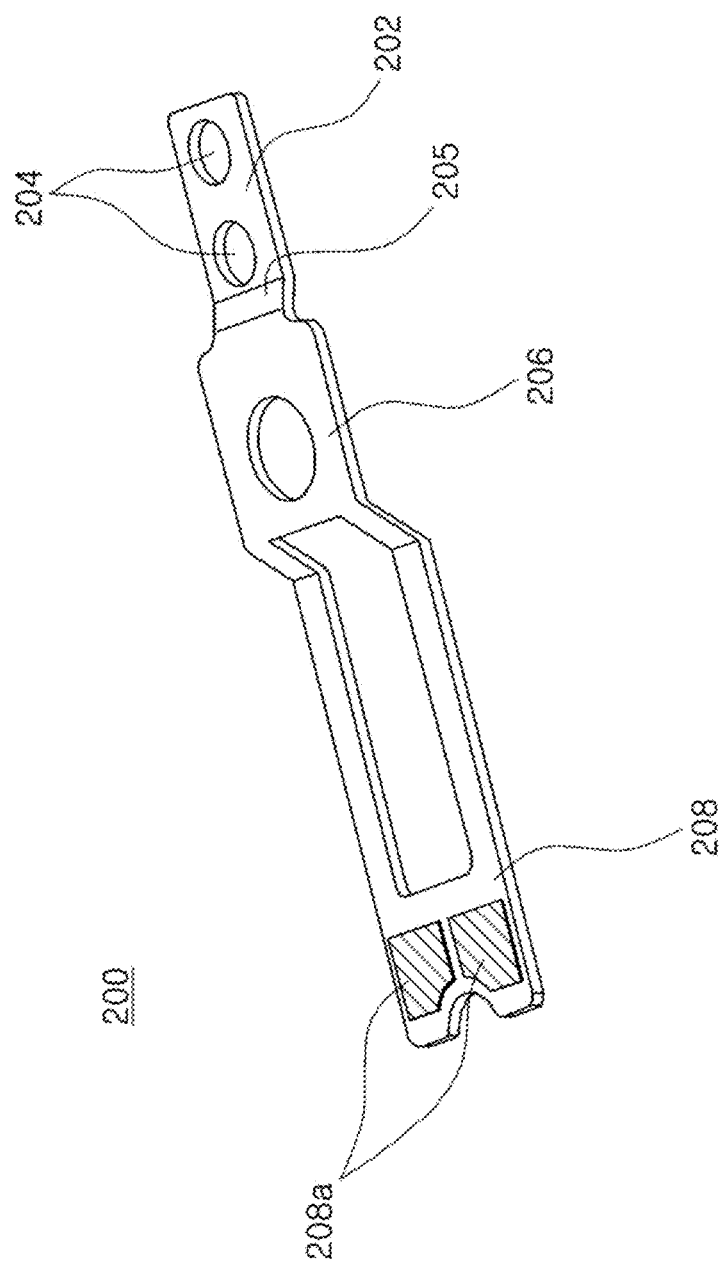
FIG. 8 is a perspective view illustrating a circuit board of the vibration generating apparatus according to an exemplary embodiment of the present disclosure.

FIG. 8 is a perspective view illustrating a circuit board of the vibration generating apparatus according to an exemplary embodiment of the present disclosure.

Referring to FIG. 8, the circuit board 200 may be connected to the piezoelectric element 160 shown in FIG. 1 and may vibrate together with the elastic member 140. The circuit board 200 may include a piezoelectric element connection part 202. In addition, the piezoelectric element connection part 202 may be provided with one or more insertion holes 204 into which the electrodes 162 of the piezoelectric element 160 are inserted.

Therefore, a soldering portion for connecting the piezoelectric element 160 and the circuit board 200 to each other may be disposed in an opening part 142c of the bottom plate 142, such that an increase in a thickness due to the soldering portion may be suppressed.

In addition, the piezoelectric element connection part 202 may be stepped with respect to a body 206. For example, the piezoelectric element connection part 202 and the body 206 may be connected to each other by an inclination part 205. In addition, the inclination part 205 may be provided with a support protrusion insertion hole into which the support protrusion 142a of the bottom plate 142 is inserted.

In addition, a single or a plurality of holes and/or grooves may be formed in the body 206 such that the body 206 may be more smoothly vibrate together with the bottom plate 142.

The circuit board 200 may include an external exposure part 208 disposed to be exposed to the outside of the upper case 122 (See FIG. 1) and provided with power supply connection terminals 208a. The external exposure part 208 may be stepped with respect to the body 206.

Figure 9:
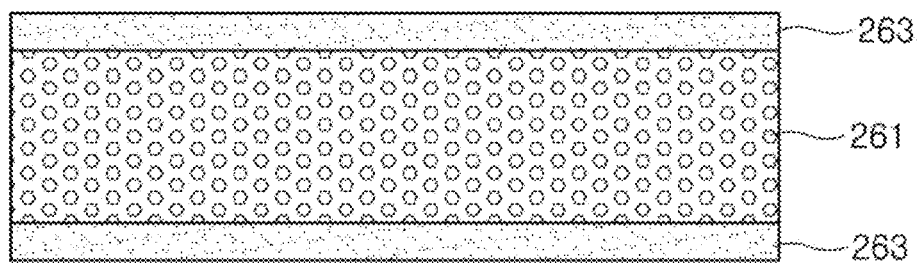
FIG. 9 is a cross-sectional view of a buffering adhesive of the vibration generating apparatus according to an exemplary embodiment of the present disclosure.

FIG. 9 is a cross-sectional view of a buffering adhesive of the vibration generating apparatus according to an exemplary embodiment of the present disclosure.

Referring to FIG. 9, the buffering adhesive 260 according to an exemplary embodiment of the present disclosure may include a base member or layer 261 having buffering properties and adhesive layers 263 applied to both surfaces of the base member 261.

The base member 261 may have the buffering properties (that is, buffering force). For example, the base member 261 may be formed of a porous expandable material so as to have excellent buffering properties. In addition, the base member 261 may have elastic force. The base member 261 may be formed of, for example, Poron, silicon, rubber, a poly material such as polyurethane, or the like. In addition, the adhesive layer 263, which has adhesion, may be formed of, for example, but not limited to, an acryl adhesive. Various materials may be used as materials of the base member 261 and the adhesive layer 263.

Figure 10:
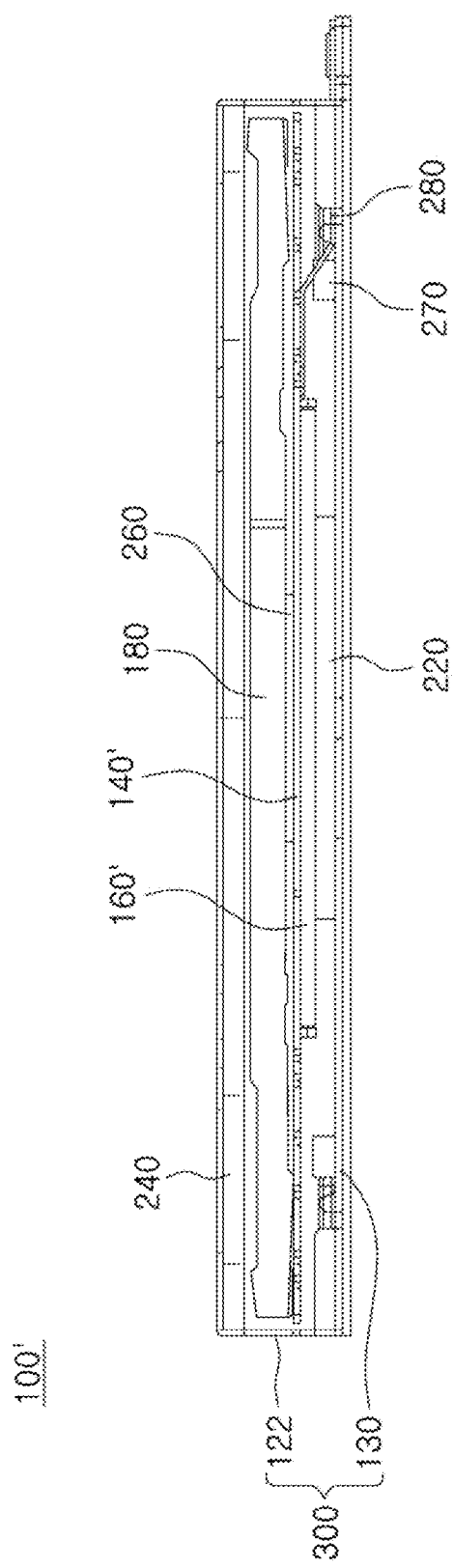
FIG. 10 is a cross-sectional view of a vibration generating apparatus according to another exemplary embodiment of the present disclosure.
Figure 11:
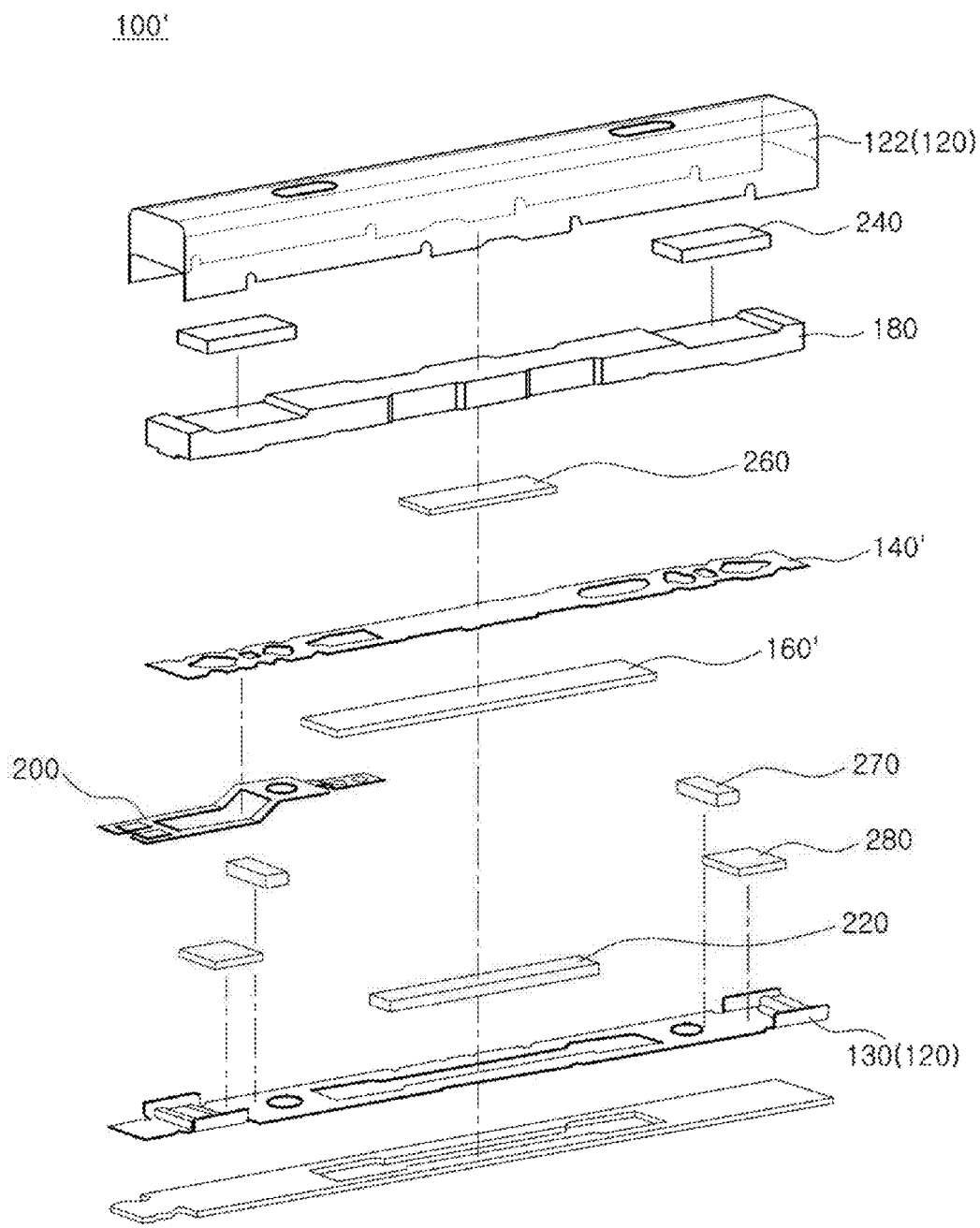
FIG. 11 is an exploded perspective view of the vibration generating apparatus according to another exemplary embodiment of the present disclosure.

FIG. 10 is a cross-sectional view of a vibration generating apparatus according to another exemplary embodiment of the present disclosure. FIG. 11 is an exploded perspective view of the vibration generating apparatus according to another exemplary embodiment of the present disclosure. FIGS. 12A and 12B are a plan view and a perspective view illustrating an elastic member of the vibration generating apparatus according to another exemplary embodiment of the present disclosure, respectively. FIGS. 12C and 12D are a plan view and a perspective view illustrating an elastic member of a vibration generating apparatus according to another exemplary embodiment of the present disclosure, respectively.

Referring to FIGS. 10 through 12D, in a vibration generating apparatus 100' according to another exemplary embodiment of the present disclosure, a piezoelectric element 160' may be provided on a lower surface of an elastic member 140', and the mass body 180 may be coupled to an upper surface of the elastic member 140' by the buffering adhesive 260. The vibration generating apparatus 100' according to another exemplary embodiment of the present disclosure is the same as or similar with the vibration generating apparatus 100 according to an exemplary embodiment of the present disclosure. Components of the vibration generating apparatus 100' that are different from those of the vibration generating apparatus 100 will be described in detail, and a detailed description for components of the vibration generating apparatus 100' that are the same as or similar with those of the vibration generating apparatus 100 will be omitted. In addition, the same or similar components will be denoted by the same reference numerals.

The vibration generating apparatus 100' according to another exemplary embodiment of the present disclosure may include the housing 120 including the upper case 122 and the lower case 130, the elastic member 140', the piezoelectric element 160', the mass body 180, the circuit board 200, and the buffering adhesive 260.

Here, referring to FIGS. 12A and 12B, the elastic member 140' may have a plate shape and include the support parts 142e formed in one or both end portions thereof in the length direction. The support parts 142e may be supported by the protrusion parts 132 of the lower case 122 shown in FIG. 4.

In addition, the elastic member 140' having the plate shape may be provided with a single or a plurality of support protrusions 142a' and 142b' for installing the piezoelectric element 160'. Two or more support protrusions 142a' may support both end surfaces of the piezoelectric element 160', respectively, and the support protrusions 142b' may support two side surfaces (front and rear surfaces) of the piezoelectric element 160' except for the both end surfaces thereof. The piezoelectric element 160' may be installed in a predetermined position of the elastic member 140', and separation of the piezoelectric element 160' from the bottom plate 142 of the elastic member 140' may be prevented.

Meanwhile, in the vibration generating apparatus 100' according to another exemplary embodiment of the present disclosure, the piezoelectric element 160' may be provided on the lower surface of the elastic member 140'. Therefore, the plurality of support protrusions 142a' and 142b' may protrude in a direction toward the lower surface of the elastic member 140'.

Referring to FIGS. 12C and 12D, the elastic member 140' may include the bottom plate 142 and one or more extension plates 144. First, the bottom plate 142 of the elastic member 140' will be described. The bottom plate 142 may be provided with the plurality of support protrusions 142a' and 142b' for installing the piezoelectric element 160'. Two or more support protrusions 142a' may support both end surfaces of the piezoelectric element 160', respectively, and the support protrusions 142b' may support two side surfaces (front and rear surfaces) of the piezoelectric element 160' except for the both end surfaces thereof. The piezoelectric element 160' may be installed in a predetermined position of the elastic member 140', and separation of the piezoelectric element 160' from the bottom plate 142 of the elastic member 140' may be prevented.

Meanwhile, in the vibration generating apparatus 100' according to another exemplary embodiment of the present disclosure, the piezoelectric element 160' may be provided on the lower surface of the elastic member 140'. Therefore, the plurality of support protrusions 142a' and 142b' may protrude in the direction toward the lower surface of the elastic member 140'.

In addition, the bottom plate 142 may include the support parts 142e formed in one or both end portions thereof, and the support parts 142e may be supported by the protrusion parts 132 of the lower case 122, shown in FIG. 4, described above.

In addition, the extension plates 144 may include the support plate parts 146 covering front and rear surfaces of the mass body 180 and the connection parts 148 connecting the support plate parts 146 and the bottom plate 142 to each other.

The connection parts 148 may be extended from front and rear surfaces of the bottom plate 142. In addition, each of the connection parts 148 may include the first and second connection parts 148*a* and 148*b* disposed to be spaced apart from each other by a predetermined interval.

Further, the support plate parts 146 may be extended in the length direction of the mass body 180.

Here, the extension plates 144 may protrude in a direction toward the upper surface of the elastic member 140'. That is, the extension plates 144 may protrude in a direction opposite to a direction in which the piezoelectric element 160' is installed.

In the vibration generating apparatus 100' according to another exemplary embodiment of the present disclosure, the mass body 180 may be buffering-coupled to the upper surface of the elastic member 140'. For example, the lower surface of the mass body 180 may be adhered to the upper surface of the elastic member 140' using the buffering adhesive 260. The piezoelectric element 160' may be provided on the lower surface of the elastic member 140'.

In addition, the buffering adhesive 260 may have a length shorter than that of the piezoelectric element 160' in the length direction. The buffering adhesive 260 may have a width equal to or smaller than that of the piezoelectric element 160'. The size of the buffering adhesive 260 may be variously formed within a range in which the deformation of the piezoelectric element 160' is not hindered.

In addition, the mass body 180 may be disposed above the elastic member 140' in a state in which the mass body 180 is mounted in the mass body cover 170 described above. In this case, the mass body cover 170 and the elastic member 140' may be adhered to each other using the buffering adhesive 260.

Meanwhile, the buffering adhesive 260 may have elastic force restoring the mass body 180 to an original position thereof in a case in which the mass body 180 moves from the original position by inertial force due to an external impact. In addition, sufficient elastic force may be required such that the mass body 180 may be restored to the original position thereof. Therefore, in an exemplary embodiment of the present disclosure, a distance between the end portion of the mass body 180 and the inner surface of the housing 120 in the length direction may be equal to or less than an elastic limit of the buffering adhesive 260. When the interval is equal to or less than the elastic limit of the buffering adhesive 260, the housing 120 may serve as a stopper stopping deformation of the mass body 180 in the length direction, such that the mass body 180 may be deformed by an amount equal to or less than the elastic limit of the buffering adhesive 260. Therefore, the buffering adhesive 260 may sufficiently perform functions thereof. For example, the interval between the end portion of the mass body 180 and the inner surface of the housing 120 in the length direction may be 3 mm or less. Therefore, the elastic limit of the buffering adhesive 260 may be 3 mm or more.

As described above, since the mass body 180 is not directly coupled to the elastic member 140' and may be coupled to the elastic member 140' or the piezoelectric element 160' using the buffering adhesive 260, the elastic member 140' may not be deformed even in the case that an external impact, or the like, occurs. Although the elastic member 140' serves to provide elastic force depending on the deformation of the piezoelectric element 160', the elastic member 140' may not be directly coupled to the mass body 180. Therefore, in a case in which the external impact, or the like, is present, impacts occurring by inertial force of the mass body 180 may not be transferred directly to the elastic member 140'. Therefore, reliability of the elastic member 140' may be improved.

The vibration generating apparatus 100' described above may be used in various electronic apparatuses.

Figure 13:
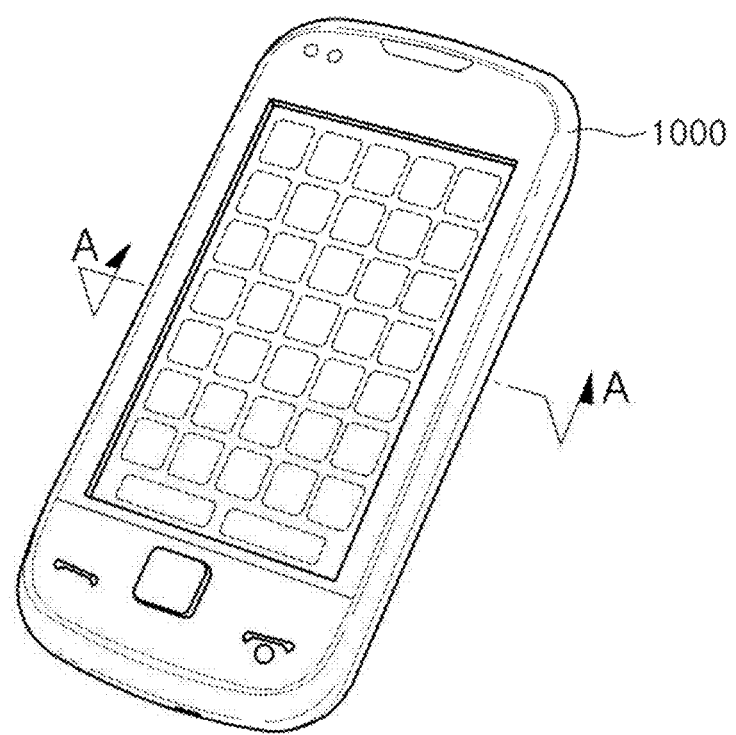
FIG. 13 is a perspective view of an electronic apparatus according to an exemplary embodiment of the present disclosure.
Figure 14:
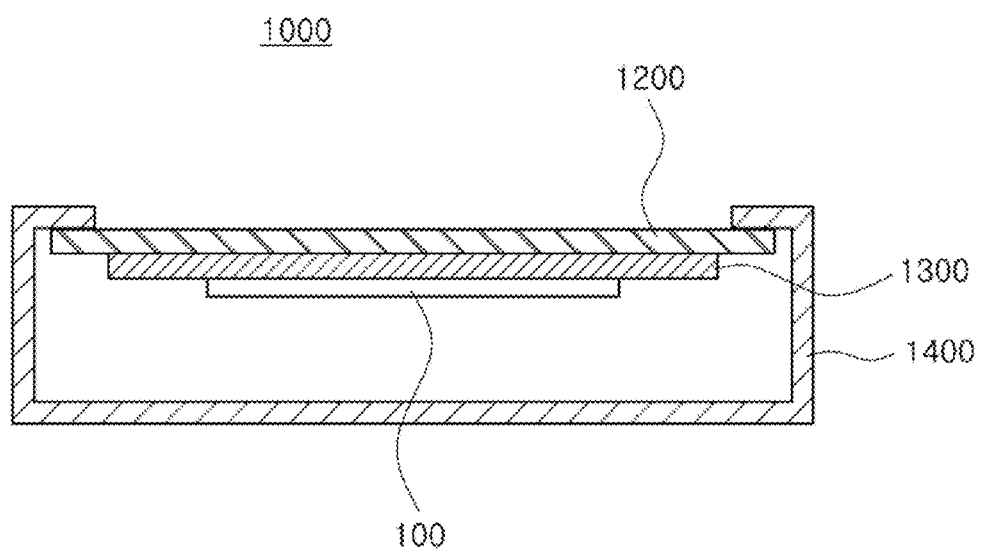
FIG. 14 is a cross-sectional view of the electronic apparatus according to an exemplary embodiment of the present disclosure.
Figure 15:
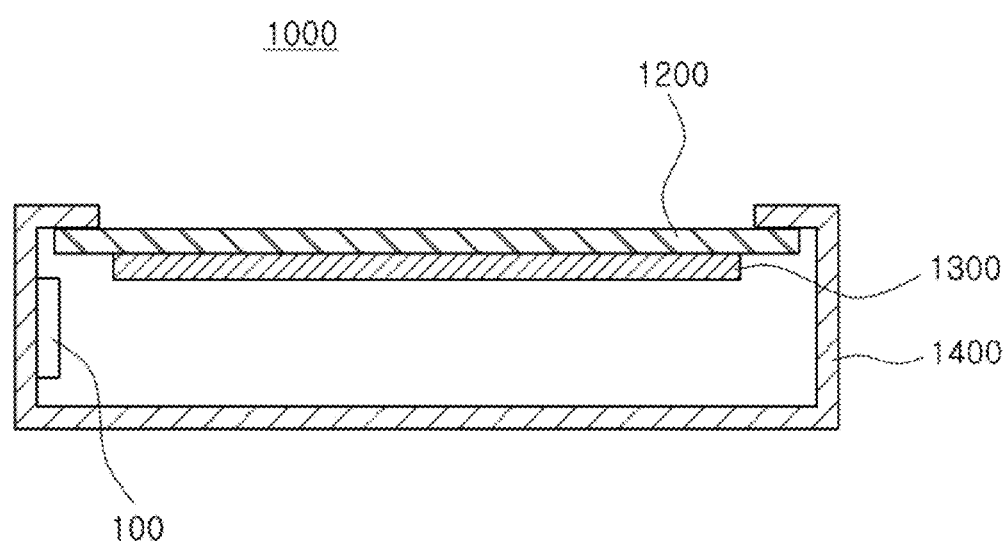
FIG. 15 is a cross-sectional view of an electronic apparatus according to another exemplary embodiment of the present disclosure.

FIG. 13 is a perspective view of an electronic apparatus according to an exemplary embodiment of the present disclosure. FIG. 14 is a cross-sectional view of the electronic apparatus according to an exemplary embodiment of the present disclosure. FIG. 15 is a cross-sectional view of an electronic apparatus according to another exemplary embodiment of the present disclosure.

As shown in FIGS. 13 through 15, an electronic apparatus 1000 according to an exemplary embodiment of the present disclosure may display an image responding to selection of a user.

Referring to FIG. 14, the electronic apparatus 1000 according to an exemplary embodiment of the present disclosure may include a display module displaying the image in response to the selection of the user and a case 1400 having an internal space in which the display module is received.

The display module may include a touch panel 1200 receiving a touch pressure of the user and a display panel 1300 mounted on a lower surface of the touch panel 1200 and providing the image depending on the selection of the user, and the vibration generating apparatus 100 or 100' according to exemplary embodiments of the present disclosure may be mounted on a lower surface of the display panel 1300 and may generate vibrations depending on selection of the user.

In addition, as shown in FIG. 15, the vibration generating apparatus 100 or 100' according to exemplary embodiments of the present disclosure may be mounted on an inner surface of the case 1400 and may provide vibrations directly to the display module.

As described above, according to exemplary embodiments of the present disclosure, compactness and slimness of the vibration generating apparatus 100 or 100' and the electronic apparatus 1000 including the same may be realized by increasing driving force through the addition of mass to a point at which displacement of a vibration plate is the greatest, as compared to the case of increasing driving force by increasing the overall mass of the vibration plate.

According to exemplary embodiments of the present disclosure, a vibration generating apparatus 100 or 100' in which a piezo element and a mover do not contact each other even in the case that an external impact, or the like, occurs, may be provided. Even in a case in which the external impact, or the like, is applied to the vibration generating apparatus 100 or 100', a phenomenon in which an impact amount due to inertia of a mass body 180 is applied directly to the piezoelectric element 160 may be prevented by a buffering adhesive 260 interposed between the mass body 180 and the piezoelectric element 160. The external impact may be absorbed or blocked by the buffering adhesive 180, and damage to the piezoelectric element 160 may be prevented.

In addition, according to exemplary embodiments of the present disclosure, a vibration generating apparatus 100 or 100' capable of absorbing impacts as well as simply preventing contact between a piezo element and a mover may be provided.

While exemplary embodiments have been shown and described above, it will be apparent to those skilled in the art that modifications and variations could be made without departing from the spirit and scope of the present disclosure as defined by the appended claims.

What is claimed is:

1. A vibration generating apparatus, comprising:
a housing having an internal space;
an elastic member mounted in the internal space;
a piezoelectric element having one surface thereof mounted on the elastic member; and
a mass body coupled to another surface of the piezoelectric element by a buffering adhesive.

2. The vibration generating apparatus of claim 1, wherein the buffering adhesive includes:
a base member having buffering properties; and
one or more adhesive layers applied to one or more surfaces of the base member.

3. The vibration generating apparatus of claim 2, wherein the base member is formed of a porous material.

4. The vibration generating apparatus of claim 2, wherein the base member has elastic force.

5. The vibration generating apparatus of claim 1, wherein the elastic member includes a bottom plate having one surface thereof on which the piezoelectric element is mounted.

6. The vibration generating apparatus of claim 5, wherein the elastic member further includes one or more extension plates extended upwardly from the bottom plate in a width direction.

7. The vibration generating apparatus of claim 6, wherein each of the extension plates includes:
a connection part having one end connected to the bottom plate and extended upwardly from the bottom plate in a length direction; and
a support plate part formed on another end of the connection part in the length direction and supporting the mass body.

8. The vibration generating apparatus of claim 1, wherein the buffering adhesive has a length shorter than that of the piezoelectric element.

9. The vibration generating apparatus of claim 1, wherein the buffering adhesive has a width equal to or smaller than that of the piezoelectric element.

10. The vibration generating apparatus of claim 1, further comprising a mass body cover covering the mass body, wherein the buffering adhesive is interposed between the mass body cover and the piezoelectric element.

11. The vibration generating apparatus of claim 1, wherein the buffering adhesive is an adhesive having buffering properties.

12. The vibration generating apparatus of claim 1, wherein an interval between an end portion of the mass body and an inner surface of the housing in a length direction is equal to or less than an elastic limit of the buffering adhesive.

13. The vibration generating apparatus of claim 1, wherein the mass body and the elastic member do not contact each other.

14. A vibration generating apparatus comprising:
a housing having an internal space;
an elastic member mounted in the internal space;
a piezoelectric element having one surface thereof mounted on the elastic member; and
a mass body buffering-coupled to the piezoelectric element or the elastic member and displaced by deformation of the piezoelectric element.

15. A vibration generating apparatus comprising:
a housing having an internal space;
an elastic member mounted in the internal space;
a piezoelectric element mounted on one surface of the elastic member; and
a mass body coupled to another surface of the elastic member by a buffering adhesive.

16. An electronic apparatus comprising:
a display module displaying an image;
a case having an internal space in which the display module is received; and
a vibration generating apparatus mounted in the case, the vibration generating apparatus including:
a housing having an internal space,
an elastic member mounted in the internal space of the housing,
a piezoelectric element having one surface thereof mounted on the elastic member and vibrating the elastic member by deformation, and
a mass body buffering-coupled to the piezoelectric element or the elastic member.

17. The electronic apparatus of claim 16, wherein the vibration generating apparatus is mounted on an inner surface of the case.

18. The electronic apparatus of claim 16, wherein the vibration generating apparatus is mounted on a lower surface of the display module.

19. The electronic apparatus of claim 16, wherein the display module includes:
a touch panel receiving a user touch interaction; and
a display panel contacting a lower surface of the touch panel and displaying an image in response to the touch interaction.

20. A vibration generating apparatus, comprising:
a piezoelectric element deforming in response to an electric signal;
an elastic member vibrated by deformation of the piezoelectric element;
a mass body; and
an adhesive with buffering properties configured to couple and buffer between the mass body and the piezoelectric element.

21. The vibration generating apparatus of claim 20, wherein the adhesive with the buffering properties comprises:
a base layer having the buffering properties; and
an adhesive layer arranged on at least one surface of the base layer.

22. The vibration generating apparatus of claim 21, wherein the base layer comprises a porous material.

23. The vibration generating apparatus of claim 20, wherein:
the mass body comprises amass body cover covering the mass body, and
the adhesive with the buffering properties is attached to one surface of the mass body cover and one surface of the piezoelectric element.

24. The vibration generating apparatus of claim 20, wherein a length of the adhesive with the buffering properties is shorter than a length of the piezoelectric element.

25. The vibration generating apparatus of claim 20, wherein a width of the adhesive with the buffering properties is equal to or smaller than a width of the piezoelectric element.

26. A vibration generating apparatus, comprising:
a piezoelectric element deforming in response to an electric signal;

an elastic member vibrated by deformation of the piezoelectric element;

a mass body; and an adhesive with buffering properties configured to couple and buffer between the mass body and the elastic member, wherein the piezoelectric element is mounted on one surface of the elastic member, and another surface of the elastic member is attached to the adhesive with the buffering properties.

27. The vibration generating apparatus of claim 26, wherein the adhesive with the buffering properties comprises:

a base layer having the buffering properties; and an adhesive layer arranged on at least one surface of the base layer.

28. The vibration generating apparatus of claim 27, wherein the base layer comprises a porous material.

29. The vibration generating apparatus of claim 26, wherein:

the mass body comprises a mass body cover covering the mass body, and the adhesive with the buffering properties attached to one surface of the mass body cover and the another surface of the elastic member.

* * * * *